(12) United States Patent
Donlin

(10) Patent No.: US 7,380,035 B1
(45) Date of Patent: May 27, 2008

(54) SOFT INJECTION RATE CONTROL FOR BUSES OR NETWORK-ON-CHIP WITH TDMA CAPABILITY

(75) Inventor: Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 233 days.

(21) Appl. No.: 11/090,118

(22) Filed: Mar. 24, 2005

(51) Int. Cl.
G06F 13/368 (2006.01)

(52) U.S. Cl. ............................ 710/123; 710/116

(58) Field of Classification Search .............. 710/113, 710/117, 305, 241, 119, 242, 123–124; 711/150
See application file for complete search history.

(56) References Cited

U.S. PATENT DOCUMENTS

| 5,760,602 | A | 6/1998 | Tan |
| 6,763,099 | B1 * | 7/2004 | Blink ............................ 379/189 |
| 6,985,783 | B2 * | 1/2006 | Li et al. ......................... 700/94 |
| 7,032,046 | B2 * | 4/2006 | Horii et al. ................... 710/113 |
| 7,065,595 | B2 * | 6/2006 | Drerup et al. ................ 710/117 |
| 2003/0156473 | A1 * | 8/2003 | Sinclair et al. .............. 365/200 |
| 2003/0163798 | A1 * | 8/2003 | Hwang et al. ................. 716/16 |
| 2004/0003211 | A1 * | 1/2004 | Damron ....................... 712/228 |
| 2004/0004999 | A1 * | 1/2004 | Koerner et al. ............. 375/224 |
| 2004/0117755 | A1 | 6/2004 | Blodget et al. |

* cited by examiner

Primary Examiner—Clifford Knoll
(74) Attorney, Agent, or Firm—Walter D. Fields; LeRoy D. Maunu

(57) ABSTRACT

A programmable logic device, in accordance with an embodiment of the present invention, may comprise a bus and a plurality of programmable masters configurable to interface the bus. A first portion of a memory may include configuration data operable to configure masters of the plurality, while a second portion of the memory may include access patterns to control when the different masters of the plurality may access the bus. An injection rate controller may control when a given master is to send data on the bus based on the access pattern associated with the master. A master controller may be operable to write the access patterns for the masters to the second portion of the configuration memory.

20 Claims, 11 Drawing Sheets

SOFT INJECTION RATE CONTROL FOR BUSES OR NETWORK-ON-CHIP WITH TDMA CAPABILITY

BACKGROUND

This invention relates to programmable logic devices, such as field programmable gate arrays (FPGA), and more specifically, to interface blocks of a programmable logic device to a bus or network and methods of controlling their access to the bus.

Programmable logic devices (PLDs) are a type of integrated circuit that can be programmed to perform specified logic functions. One type of PLD, the field programmable gate array (FPGA), typically includes an array of programmable resources, which may include, for example, input/output blocks (IOBs), configurable logic blocks (CLBs), dedicated random access memory blocks (BRAM), multipliers, digital signal processing blocks (DSPs), processors, clock managers, delay lock loops (DLLs), transceivers, and so forth.

Each programmable resource typically includes both programmable interconnect and programmable logic. The programmable interconnect typically includes a large number of interconnect lines of varying lengths interconnected by programmable interconnect points (PIPs). The programmable logic may implement the logic of a user design using programmable elements that can include, for example, function generators, registers, arithmetic logic, and so forth.

The programmable interconnect and programmable logic are typically programmed by loading a stream of configuration data into internal configuration memory that define how the programmable elements are configured. The configuration data can be read from memory (e.g., from an external PROM) or written into the FPGA by an external device. The collective states of the individual memory cells of the configuration memory then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices, the functionality of the device may be understood to be controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs may be programmed by applying a processing layer, such as a metal layer, that programmably interconnects the various elements on the device. These PLDs may be known as mask programmable devices. PLDs can also be implemented in other ways, e.g., using fuse or antifuse technology. The terms "PLD" and "programmable logic device" may thus include but are not necessarily limited to these exemplary devices, as well as encompassing devices that may be only partially programmable.

As the density and complexity of PLDs has increased, so too has the need for greater capacity and more efficient communication circuits such as those associated with interfacing buses and/or network-on-chip. In the case of networking solutions, the increase in the number of peers or bus masters that may be associated with a bus may call for finer and/or more granular control of their access to the bus.

For circuits of a PLD directed to a bus or network-on-chip therefore, it may be desirable for at least some of the programmable resources of the PLD to be dedicated to controlling when a bus master of a plurality may inject data onto a given bus or network.

SUMMARY OF THE INVENTION

Typically, only one bus master component (e.g., soft IP core) is allowed write access to the bus at any given time. To manage when a given master of a plurality may inject or send data on the bus, a distributed arbitration solution for a PLD, in accordance with an embodiment of the present invention, may send usage data for bus allocations to each of the masters on the bus so that they may each individually manage their use of the bus based on the pre-designated usage data received.

A programmable logic device, in accordance with an embodiment of the present invention, may comprise a bus and a plurality of programmable masters configurable to interface the bus. A first portion of a memory may source configuration data operable to configure the masters of the plurality, and a second portion may source access patterns associated with controlling respective masters of the plurality. At least one injection rate controller may selectively enable at least one of the masters of the plurality to send data to the bus based on its associated access pattern. Each access pattern may include a sequence of bits corresponding to time slots of the bus In another embodiment, a bus interface block for a programmable logic device (PLD) may include a send buffer to buffer data to be sent on a bus of the PLD. A transmission engine having an enable line may inject data from the send buffer onto the bus. An injection rate controller may be coupled to the enable line to cycle through an access pattern associated with the bus interface block and selectively enable the transmission engine based on the access pattern. The access pattern may have a sequence of bits corresponding to time slots of the bus.

BRIEF DESCRIPTION OF THE DRAWINGS

Embodiments and features of the present invention may become more apparent from the detailed description and the appended claims, with reference to the accompanying drawings, in which:

DETAILED DESCRIPTION

Figure 1:
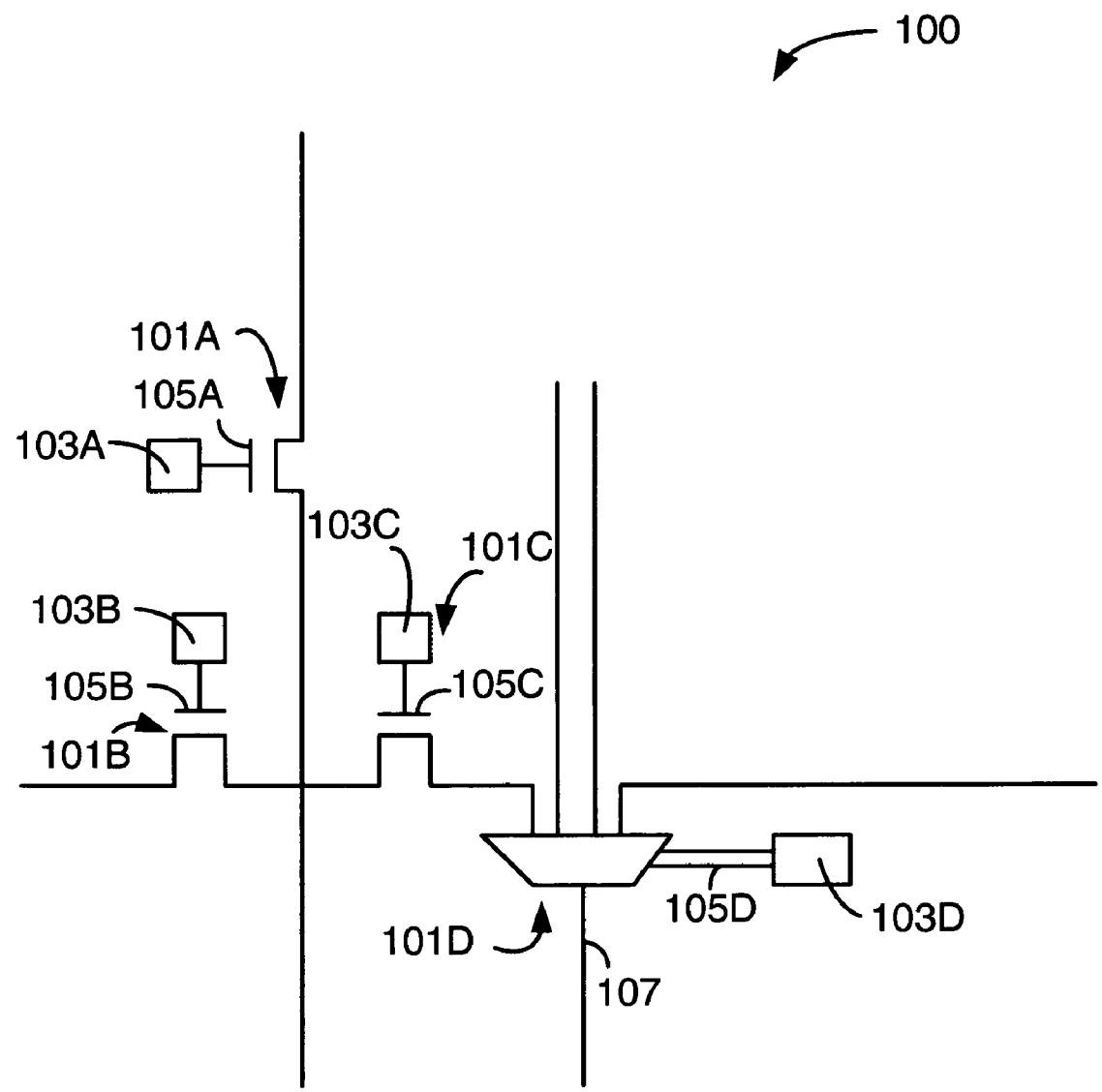
FIG. 1 is a simplified schematic of a portion of a PLD, useful for gaining an understanding of certain embodiments of the present invention, showing, at a low level, programmable logic components of a logic plane of the PLD and associated configuration memory of a configuration plane of the PLD.

In the following description, numerous specific details may be set forth to provide an understanding of exemplary embodiments of the present invention. It will be understood, however, that alternative embodiments may comprise sub-combinations of the disclosed examples. Additionally, readily established circuits and procedures of exemplary embodiments may be disclosed in simplified form (e.g., simplified block diagram and/or simplified description) to avoid obscuring an understanding of the embodiments with excessive detail. Likewise, to aid a clear and concise disclosure, description of known processes or devices—for example, reads and writes to block RAM, state machines, programmable logic blocks, programmable interconnects, ports—may similarly be simplified.

As used herein, the term "bus," while at times stated in the singular, may, depending on context, refer to a plurality of buses, to a network comprising a plurality of buses, to a network-on-chip, or to any combination of the above.

For certain embodiments, a PLD may comprise a bus and various programmable logic components (e.g., bus masters) that may be configured and operable to send or 'inject' data onto the bus, which configured components may include soft IP cores, embedded processors, soft processors, memory controllers, and other types of logic resources. Such devices may also form part of a group of peers operable to interface a particular bus or network.

Conceptually, a bus master may be characterized as being operable in a "logic plane" of a PLD to interface a bus for communication with other peers on the bus. The configuration of the master, in one embodiment, may be performed in the configuration plane, which may be simplistically described as transparent or independent of the logic operation of the user-defined circuits within the logic plane of the PLD. Note that logic and configuration planes are merely conceptual, and are used herein for descriptive purposes only. In actual physically implementations, logic and configuration portions may share one or more planes.

In a particular embodiment, a given portion of the configuration memory may be paired with a particular bus master and be operable to define its configuration. It may also designate the behavior for a transmission engine of the bus master for controlling injection rate, the order, frequency, and/or pattern by which the bus master may access the bus.

As discussed above, buses and bus masters in the logic plane may be configured to use a time-division-multiple-access (TDMA) type solution of arbitration for controlling when the bus masters may access the bus. Typically, only one master of the peers may send data or inject data onto the bus in a particular time slot of a sequence of time slots.

Regarding the bandwidth allocations, each bus master of the peers may comprise an access pattern from which the master may itself determine whether it is enabled during a given time slot to inject data onto the bus. In particular embodiments of the present invention, the access patterns may be related to part of the configuration data stored in portions of the configuration memory that is associated with the masters.

By embodiments of the present invention, configuration data comprising the access pattern may be communicated to the bus masters (e.g., of a peer network) using a communication channel of the configuration plane that is already in place for configuring the programmable logic components. By some perspectives, the configuration communication channel may be described as being orthogonal and/or independent to communication channels of the logic plane, such as the TDMA bus or peer-to-peer network. Thus, the bus masters may be configured without consuming bandwidth of the bus or network.

Referencing FIG. 1, a PLD 100 may comprise a logic plane which, at a low level may comprise, e.g., programmable logic components 101A, 101B, 101C, 101D. With respect to transistors 101A, 101B, 101C, the state of the transistors (e.g., open, closed) may be determined by configured data stored in configuration memory elements 103A, 103B, 103C, respectively, which may be electrically coupled to control gates 105A, 105B, 105C of the transistors. Similarly, multiplexer 101D may be coupled via control lines 105D to configuration memory elements 103D. The multiplexer 101D selection may be determined by configuration data stored in configuration memory elements 103D.

Thus, memory elements 103A, 103B, 103C, and 103D may be understood to form part of the configuration memory plane of the PLD 100.

Figure 2:
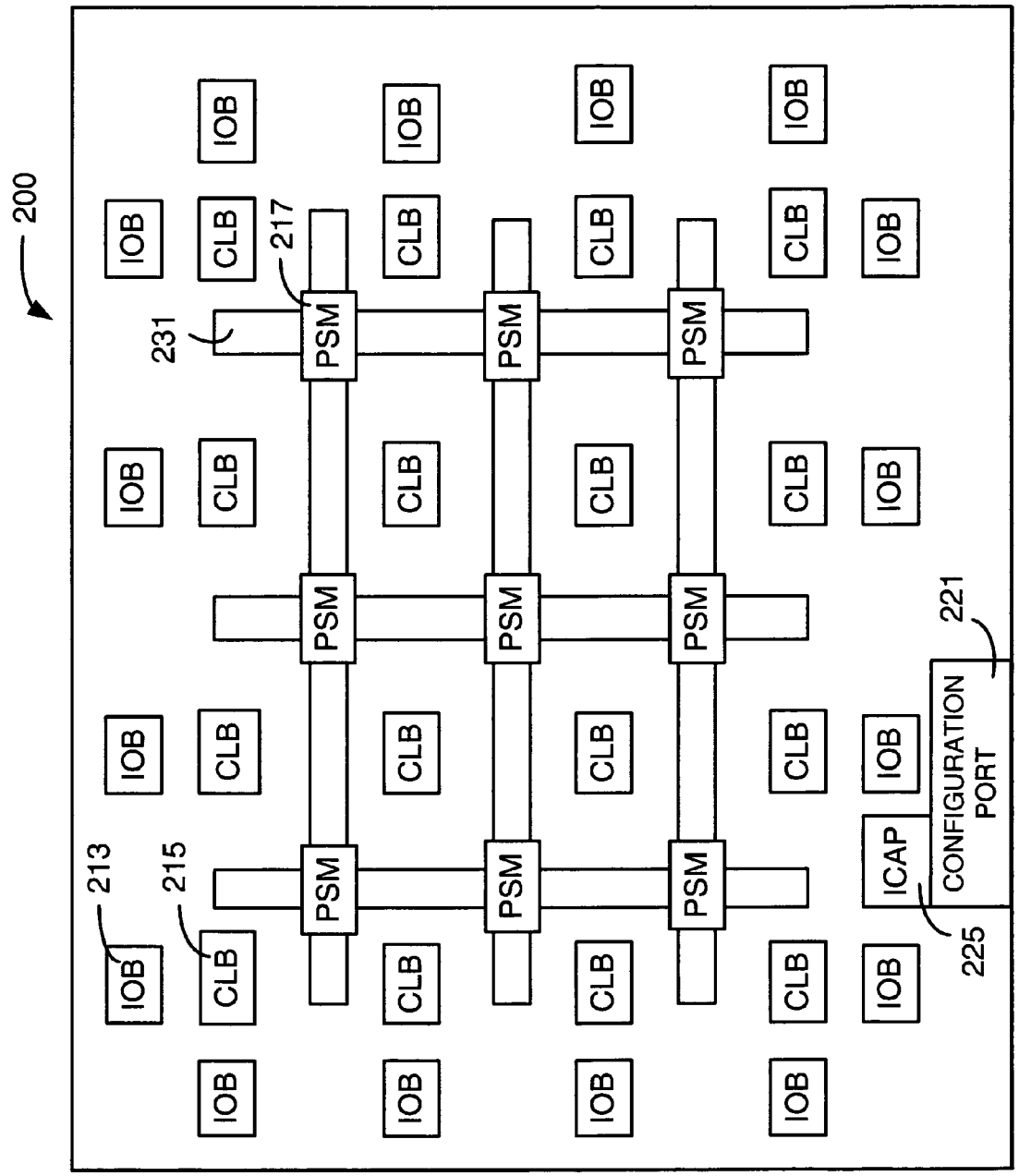
FIG. 2 is a simplified block diagram of a PLD of a particular architecture, useful for gaining an understanding of certain embodiments of the present invention.

Referencing FIG. 2, programmable logic of PLD 200 may comprise user programmable logic such as Input-Output Blocks (IOBs) 213, Configurable Logic Blocks (CLBs) 215, and a programmable interconnect 231, which may comprise Programmable Switch Matrices (PSMs) 217 and Programmable Interconnection Points (PIPs, not shown). These resources may be configurable through a configuration port 221 operable to access the configuration memory. In particular PLDs, logic internal to the PLD and of the logic plane might also be able to access the configuration memory via an internal one of such configuration access port (ICAP) 225.

Further referencing FIG. 2, the configuration memory may, in some cases, be at least partially distributed amongst and within the various programmable logic components of the PLD (e.g., CLBs, IOBs, PSMs, PIPs, etc.). That is, a particular programmable component may comprise its own associated portion of the configuration memory. Other portions of the configuration memory, on the other hand, may be external to particular programmable logic components and might comprise, e.g., a portion of a block of random access memories (BRAM or block RAM).

Figure 3:
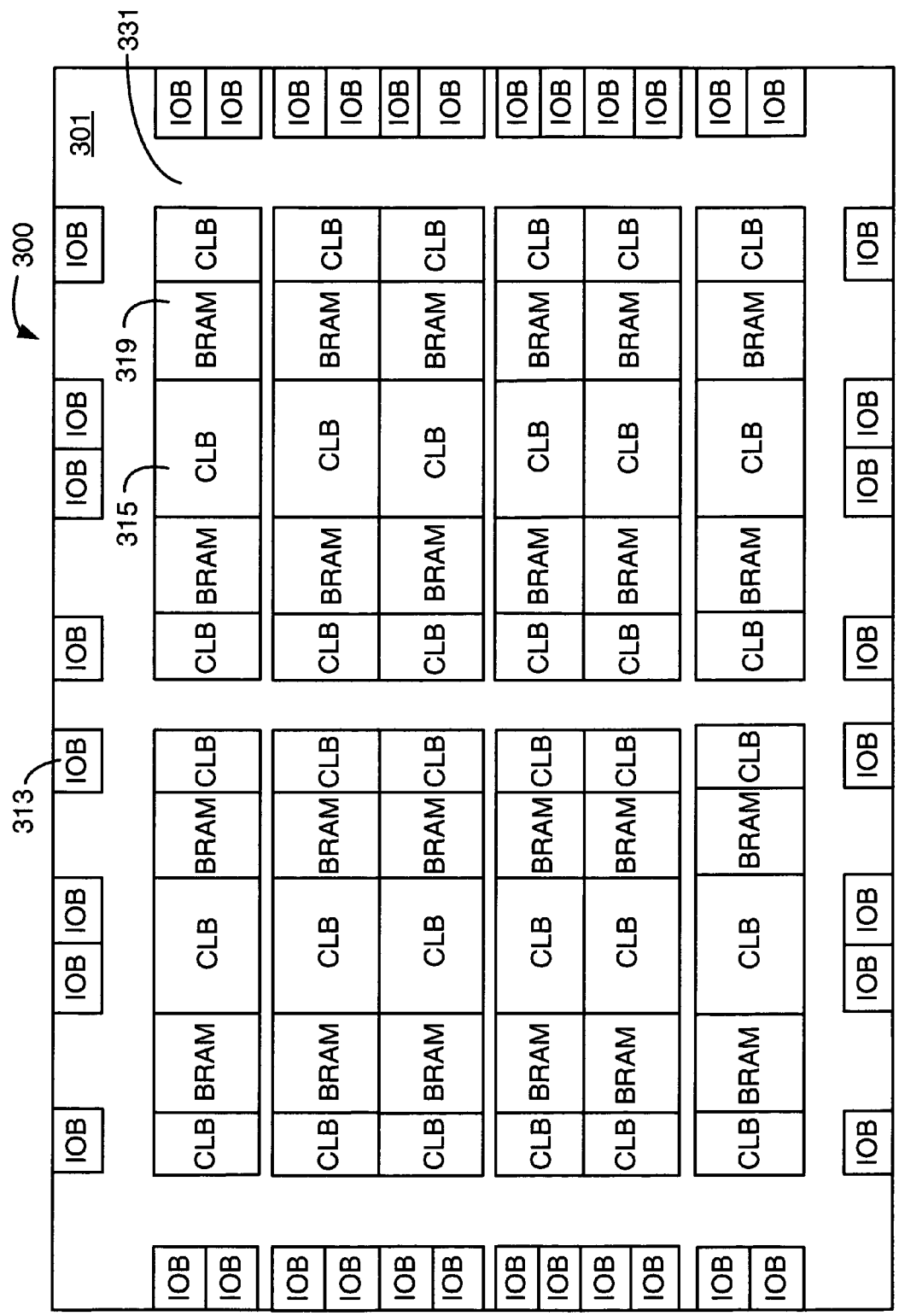
FIG. 3 is a simplified block diagram of a PLD of a particular architecture showing various blocks of random access memory, useful for gaining an understanding of certain embodiments of the present invention.

Referencing FIG. 3, such BRAM 319 may be located in proximity to groups of IOBs 313, CLBs 315, wherein neighboring interconnect circuitry 331 may be configured to connect the BRAMs 319 to associated programmable logic (e.g., IOBs 313, CLBs 315, etc.). It may be understood that the simple architectures of the embodiments described with reference to FIGS. 2 and 3 may be representative of a wide variety of possible configuration memory and PLD architectures, which in turn may also be consistent with embodiments of the present invention.

Figure 4:
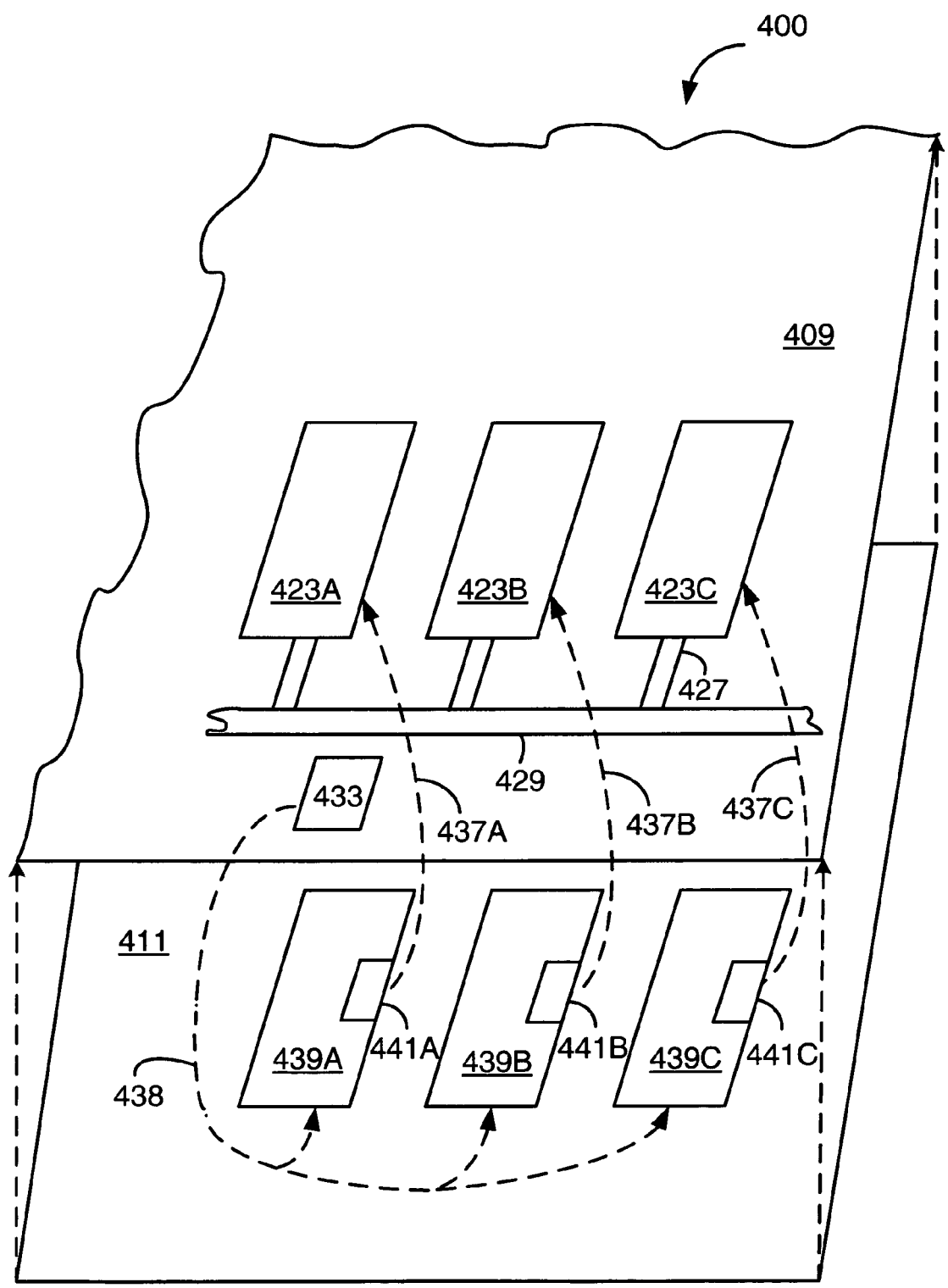
FIG. 4 is a conceptual, simplified block diagram of a PLD, showing relationships between various resources of a logic plane and a configuration plane, according to particular embodiments of the present invention.

Referencing FIG. 4, a PLD 400 (e.g., an FPGA) may comprise, on a conceptual level, a logic plane 409 associated with the programmable logic components of the PLD. The PLD 400 may further comprise configuration memory of a configuration plane 411. The configuration memory may store configuration data to be associated with the configurable/programmable resources of the logic plane. For example, one or more configuration memories 439A, 439B, 439C may have configuration data to be associated with configuring bus masters 423A, 423B, 423C respectively to interface bus or network 429, e.g., as part of a peer-to-peer network.

In a particular embodiment, configuration memories 439A, 439B, 439C may comprise access patterns 441A, 441B, 441C that map 437A, 437B, 437C to respective injection engines of bus masters 423A, 423B, 423C to control when they may access the bus 429. Further, it may be understood that bus 429 may be formed from programmable routing resources (e.g., programmable interconnect 231, PSMs 217, PIPs, FIG. 2) within the library of programmable logic resources of the PLD. Such bus or a portion of bus master might also be defined in part by one or more soft IP cores.

As used herein, a soft IP core may be understood to be representative of a group of the programmable resources of a PLD that are to be configured per a given library net list or hardware description language (HDL) sequence. Such soft IP cores may be available to perform a wide variety of tasks and may serve many purposes. For example, some soft IP cores may define a multiplexer, an adder, a multiplier, an accumulator, a block RAM, a bus interface, shift registers, encryptors/decryptors, a FIR filter, content-addressable memory, an SDRAM controller, an arbitrator and bus structure, a soft processor core, or numerous other possible logic components of a PLD.

Continuing with reference to FIG. 4, in a particular embodiment, the access patterns 441A, 441B, 441C may comprise a sequence of bits wherein each bit of the pattern may represent a time slot (e.g., time slice, time period, etc.) to a sequence of slots across an accumulated duration. The value of a given bit from the access pattern may enable or disable the bus master in a given interval associated with the bit examined from the access pattern. The enabling may allow the master to write or inject data onto bus 429 during the time slot associated with the bit's examination. For example, if access is divided into a sequence of 16 slots, each access pattern may be a 16-bit pattern where a "1" means that the associated master may transmit during that slot, and a "0" means that the master may not transmit.

Typically, the access patterns 441A, 441B, 441C may be defined or generated in a complementary or orthogonal interrelationship to one another such that only one of the bus masters 423A, 423B, 423C may be enabled to write or inject data onto the bus 429 during a given time slot. Further, the bandwidth allocation or the priority, frequency and/or order by which a given bus master may access the bus may be designated by its associated bus access pattern 441A, 441B, 441C and its ratio of one to zero bits.

Further referencing FIG. 4, PLD 400 may have the ability to adjust priorities and/or bandwidth allocations of the respective bus masters 423A, 423B, 423C by assigning the bus masters different bus access patterns. For example, configuration memory 439A may comprise bus access pattern 441A, which may enable bus master 423A to access the bus during fifty percent of the time slots of a sequence of time slots. To lower its priority, the access pattern 441A may be replaced with another access pattern that may designate only a twenty-five percent bandwidth allocation. The priority of the other bus masters may then be allowed to increase for obtaining greater access to the bus as made available by the reduced bandwidth reallocation of bus master 423A.

Replacement of access patterns 441A, 441B, 441C in configuration memories 439A, 439B, 439C may be performed, in a particular embodiment, by programmable controller 433 of the logic plane 409. That is, programmable controller 433 may access the configuration memories via access path 438 and then replace or overwrite the bit patterns 441A, 441B, 441C with other access patterns. The bus masters 423A, 423B, 423C associated per mappings 437A, 437B, 437C with the access patterns 441A, 441B and 441C may, in this embodiment, be regarded as of a peer-group within the control of controller 433.

In a further embodiment, an internal configuration access port (e.g., 225, FIG. 2) may be structured to make the injection rate registers accessible to receive access patterns from the logic plane 409 and/or the control of controller 433. In an alternative embodiment, the controller may access the configuration memories 439A, 439B, 439C via a data path of a configuration memory bus 429 or a specialized control bus (not shown) of the configuration plane orthogonal to the logic plane.

Figure 5:
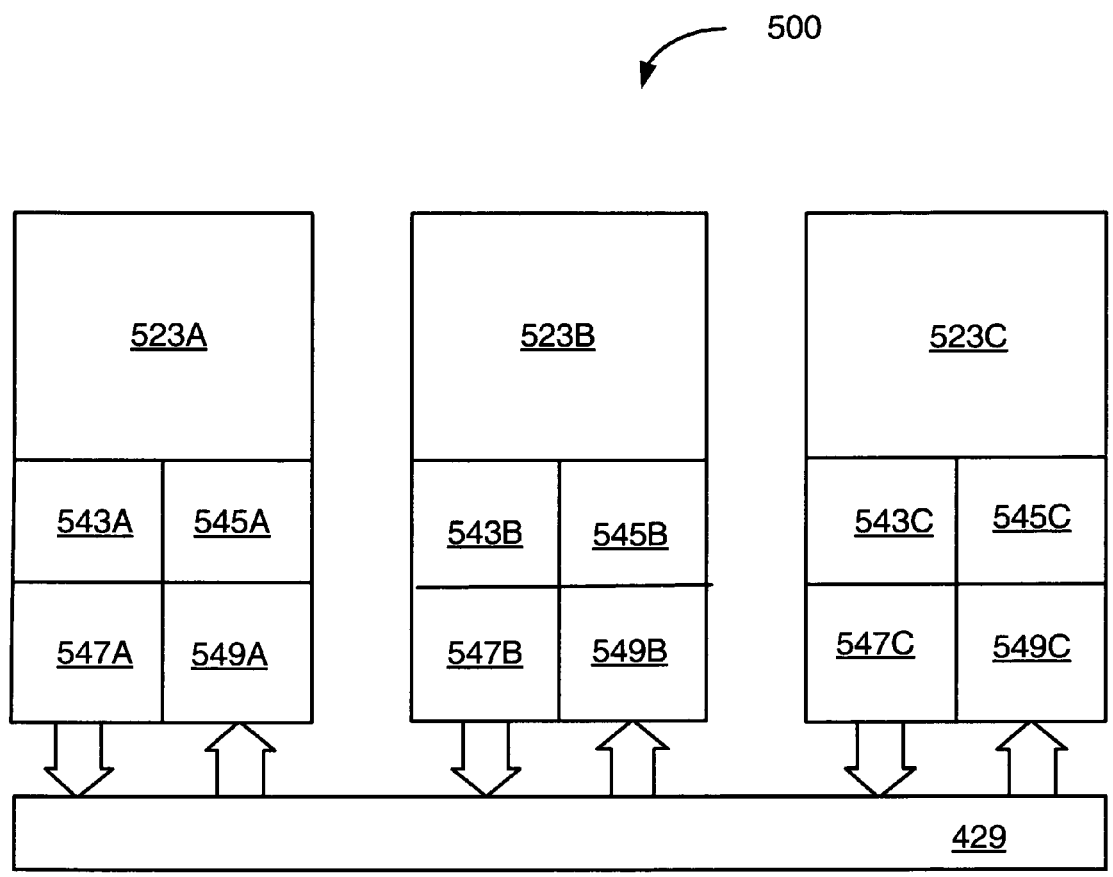
FIG. 5 is a simplified block diagram of a PLD, according to an embodiment of the present invention, showing a plurality of interface blocks interfacing a bus.

Referencing FIG. 5, a PLD 500 may comprise a bus or network 429 of a TDMA-type of arbitration situation, which may be implemented using the programmable resources of the device 500. For example, in accordance with an embodiment, the bus 429 may comprise a hierarchy of buses, or form part of a network-on-chip of TDMA-type arbitration.

Bus masters 523A, 523B, 523C of the interface blocks may comprise send buffers 543A, 543B, 543C; receive buffers 545A, 545B, 545C; transmission engines with injection rate controllers 547A, 547B, 547C; and receive interfaces 549A, 549B, 549C. The receiver portions of the interface blocks may be operable to receive data from the bus 429 via the receiving interfaces 549A, 549B, 549C according to a given receive protocol.

Further referencing FIG. 5, bus masters 523A, 523B, 523C of the interface blocks may be selectively enabled or coupled to write/send/inject data onto the bus 429 by the injection rate controllers 547A, 547B, 547C. In a particular embodiment, only one bus master of the plurality of bus masters 523A, 523B, 523C may be selectively enabled, dependent on the access patterns, during each given time period to write/send/inject data onto bus 429.

Injection rate controllers 547A, 547B, 547C may be configured with individual priorities by which to operate respective bus masters 523A, 523B, 523C. In other words, the assigned bandwidths may designate the priorities by which they may be allowed to write/send/inject data onto the bus. For example, bus master 523A may be assigned a priority allowing it to write or inject data onto the bus during 50 percent of the time slots of a given sequence of time slots. Similarly, bus master 523B may be assigned a priority allowing it to write or send data to the bus during 25 percent of the time slots of the sequence. In a further embodiment, the controlling logic of one of the bus masters may have the capability to adjust the priority of one or more of the bus masters 423A, 423B, 423C. Further, in some embodiments, it may be capable of adjusting priorities dynamically in response to a given state of the bus network.

In another embodiment, the interface blocks may comprise soft IP cores for the masters that may be implemented using programmable logic resources of the logic plane 409 of the device 500. For example, in a particular embodiment, bus master 523A may comprise a soft processor implemented as a soft IP core. Similarly, bus master 523B may comprise an encryption/decryption component operable to encrypt or decrypt data it receives and sends on the bus 429. Bus master 523C may comprise yet another transfer/communication application (e.g., data compression logic component). Further, the bus masters 523A, 523B, 523C may be operable to send and receive data to and from each other via the bus, for example, for processing, encryption or decryption, and/or compression or decompression. In an alternative embodiment, the bus masters may be defined by alternative logic (e.g., an embedded microprocessor, a read-only memory, a port, etc.). The alternative logic components may or may not be implemented using programmable logic resources of the PLD 500.

Figure 6:
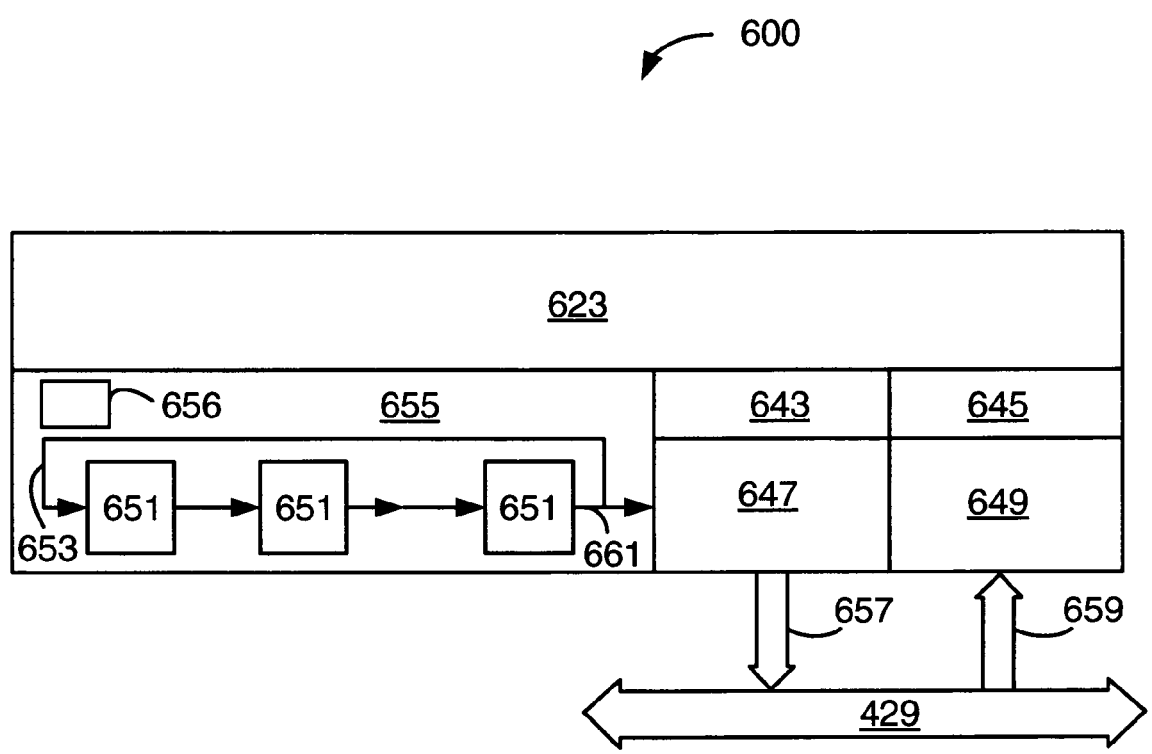
FIG. 6 is a simplified block diagram of a portion of a PLD according to an embodiment of the present invention, showing injection control logic associated with a transmission engine of a bus master of an interface block.

Referencing FIG. 6, a PLD 600 may comprise an interface block having a bus master 623 that may be coupled by a transmit path 657 and a receive path 659 to a TDMA distributed arbitration bus or network 429. The interface block 623 may interface the bus by way of send buffer 643, receive buffer 645, transmission engine 647, receive engine 649, and injection rate control logic 655. The injection rate control logic 655 may drive a transmission enable line 661 to control operation of transmission engine 647.

In one embodiment, the injection control logic 655 may comprise at least one shift register 651 (e.g., an SRL16). In further embodiments a plurality of shift registers may be coupled in series (e.g., one shift register outputting to the input of another shift register) so as to function as a single shift register of longer sequential series. A feedback line (e.g., feedback path) 653 may couple an output from the registers back to an input register. In a particular embodiment, the shift register may be loaded serially or, alternatively, in parallel via a latch or memory write load procedure.

Further referencing FIG. 6, the transmission engine 647 may enable the bus master 623 to send/inject/write data onto the bus 429, dependent upon a given bit of the access pattern that may be output from a register to output-enable line 661 and examined during the cycling of the bit pattern.

With a plurality of such masters, as represented in FIG. 5, each may have its own injection rate control logic 655 with shift registers 651 operable to cycle their own access patterns. The different access patterns stored therein may be of complementary/orthogonal interrelationship, wherein the patterns collectively may allow only one of the bus masters to inject data onto the bus 429 during a given period of time.

For example, a given shift register may be programmed with a sequence of bits to an access pattern such that when the register 651 outputs a logic "1," the injection rate controller may enable the bus master 623 to transmit data (via transmission engine 647) onto the bus or network 429. During this time interval, the sequence into other access patterns may present zeros to the injection rate controllers so as to disable transmission by the other masters.

In another embodiment, a function look-up table (LUT) of the PLD may be used to implement, functionally, the at least one shift register 651. For example, the function LUT may implement a 16-bit deep shift register 651. In other embodiments, the TDMA bus/network 429 may require greater granularity in assigning bandwidth allocation and controlling access. Accordingly, such embodiments may use more than 16 sequential time slots, wherein a plurality of 16-bit shift registers might then be coupled or chained together to create greater depth. Such extensions could potentially provide TDMA solutions offering 32, 48, 64, . . . , etc., time slots by which to allocate bandwidths and priorities amongst a plurality of masters.

Depending on the particular embodiment, different methods may be used to configure the shift registers 651 with access patterns. For example, in one embodiment, the access pattern to be stored in a shift register 651 may arrive within a portion of a control message to its respective bus master 623 over the TDMA bus/network 429 of the logic plane. Processing control logic may interpret the message and then act upon the message to shift the bits of the access pattern into the chain of shift registers 651. Such serial-shift, load control circuitry may be replicated in the TDMA bus interfaces to each of the bus masters.

In another embodiment, the shift registers or chain of shift registers 651 may be accessible as a portion of the configuration memory. The access patterns can then be stored therein as though a portion of the configuration memory of the configuration plane apart from the logic plane, and can be performed using communication channels of the configuration plane of the device 600. Accordingly, the registers may be viewed as intersecting both the configuration plane and the logic plane of the PLD. In one sense, the memory may be addressable and accessed, by a first data port, as though a part of the configuration plane. Thereafter, it may then be operable, per a second data port, as a shift register in the logic plane where it may cycle through the access patterns stored therein.

In a further embodiment, the physical layout of the shift registers associated with the bus masters of a given network may be organized within the PLD for grouped association with memory of the configuration memory such that a minimum number of frame transfers (e.g., data pages, data frames) may be effective to write or change the injection/access patterns of the bus masters.

With regard to clocking of the access patterns, further referencing FIG. 6, a given time slot of the TDMA sequential allocations may span one or more cycles of a bus clock. Accordingly, the shift register or chain of shift registers 651 may be clocked by an advancement clock having a frequency of sub-harmonic relationship to the actual bus frequency. In some solutions, the transmission engine 647 may be capable of per-cycle data transmission. With such performance capability, a long shift register chain 651 might then be realized to hold a long sequence of bits to an access pattern, and the register could be clocked at the actual bus frequency to provide per-cycle granularity in the control of masters interfacing the bus 429.

Figure 7:
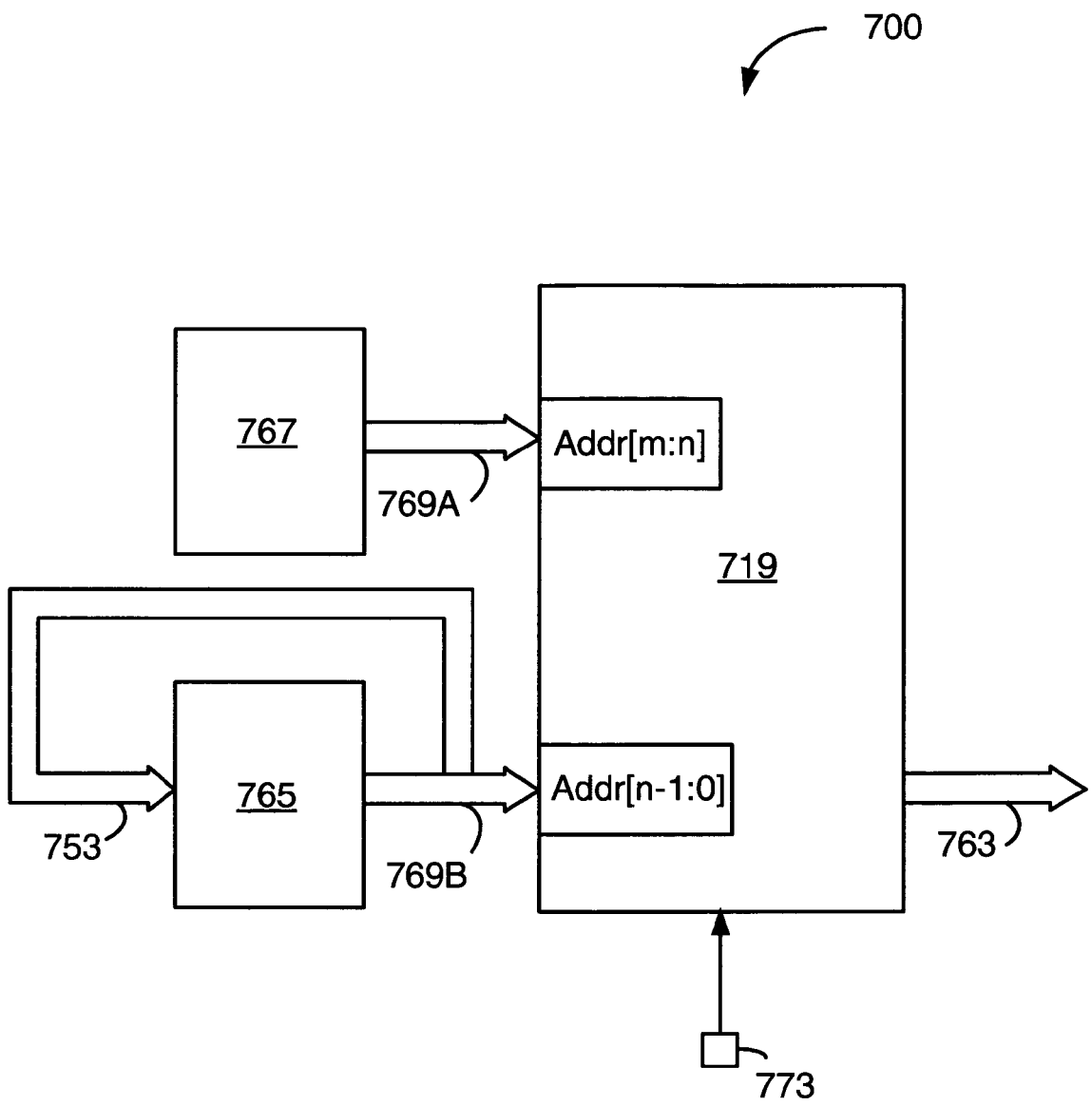
FIG. 7 is a simplified block diagram of a portion of a PLD, showing a block of random access memory (BRAM) of the PLD that may be configured, according to an embodiment of the present invention, to assist injection control.

Referencing FIG. 7, a PLD 700, in accordance with yet another embodiment, may comprise a BRAM 719 with data output lines 763 operable to drive a bus/network transmit engine for an associated bus master(s). The BRAM may comprise a plurality of predetermined access patterns that may be selected for presentment to the transmit engine. In a particular embodiment, the bit patterns may comprise an extensive sequence of bits, e.g., of 128, 256, or even more bits, as may be accommodated in large memory resources such as the BRAM 719.

In a particular embodiment, BRAM 719 may be addressable via upper address bits 769A and lower address bits 769B. The lower address bits A[n-1:0] may be operable to enable sequential addressing to different bits of a given access pattern within the memory. For example, a configurator may initially store an access pattern into a group of sequencable memory cells in a column of the memory associated with a data output line. A counter 765 may then be configured to sequentially address an address range associated with the different cells of the column. By such addressing, the memory may cycle through and present at its output for examination the different bits of the predetermined access pattern. In a further embodiment, the counter may be configured to address non-sequentially within the available address space, as an operable state-machine hopping around in the address space. In this configuration, the present state of the counter 765 as presented to address lines 765B for driving the lower significant bits A[n-1:0] of addressable memory 719, may be provided as feedback as a variable input to drive the conditional sequencing of the state-machine's or sequencer's 765 next state. Accordingly, it may be understood that such state-machine type realization for the counter may be configured to cycle through only a portion of an address range that might otherwise be available via the lower significant bits A[n-1:0] of the memory. Likewise, it may alternatively be configured to repetitively sequence through the entire range.

In a further embodiment, the memory may be configured with a plurality of different predetermined access patterns. An allocator, such as a pattern select register 767, may drive upper significant address lines 769A for driving upper address bits A[m:n] to designate which of the plurality of predetermined access patterns to present at its output. For example, a configurator may store the sequence of bits of the different predetermined access patterns into different groups of sequencable memory cells, e.g., of a given column of the memory mappable to a data output associated with a master. The controller 765 may then sequence through a select one of the plurality of access patterns via different sequentially addressable regions of the memory as designated by the allocator or pattern select register 767.

To change a bandwidth allocation to the associated master, the allocator may be updated to select a different group of sequencable cells with different selection bits. For example, the allocator may modify the selection responsive to a bandwidth reallocation request. The modification may, e.g., increase or decrease the bandwidth allocation for the master by selecting an access pattern having a greater or smaller ratio of one-to-zero bits.

To configure the memory with the predetermined access patterns, it may be programmed as a portion of an address space of the configuration memory and within the configuration plane of the PLD. Thereafter, a configuration sequencer of the PLD may configure the internal interconnects to associate different data lines of the memory to different masters. During such reprogramming provision, read/write control logic may temporarily configure the memory to source a disable state (zero-state) to each of the masters of a given peer-to-peer network. Accordingly, bus contention may be mitigated during the time required for configuration/modification of bandwidth allocations to the masters.

If a bandwidth reallocation switches between different access patterns within a single cycle, unpredictability may arise if one access pattern is output during the beginning of a cycle and then the replacement access pattern is output during the remainder of the cycle. Typically, such possibility for bus contention may be overcome by first selecting a null output from the memory to be presented to all masters—all zeros at the data output 763—as an intermediate step to switching between select access patterns. For example, turning back with reference to the embodiment described relative to FIG. 6, a hold flag 656 may be activated and operable to signal the shift register to halt operations and send null state to the transmission engine 647. But, for some embodiments where bus contention may be tolerated, the transition in access pattern selection may be performed directly absent the intermediate output of the null state.

If the bus masters are to be disabled while access patterns are being reset, in one example, the memory sourcing the access patterns may select a location pre-programmed with a null pattern. In another example, the memories or registers associated with controlling the masters may initially be held, cleared or programmed with the null patterns, and then programmed with the new replacement access patterns.

Figure 8:
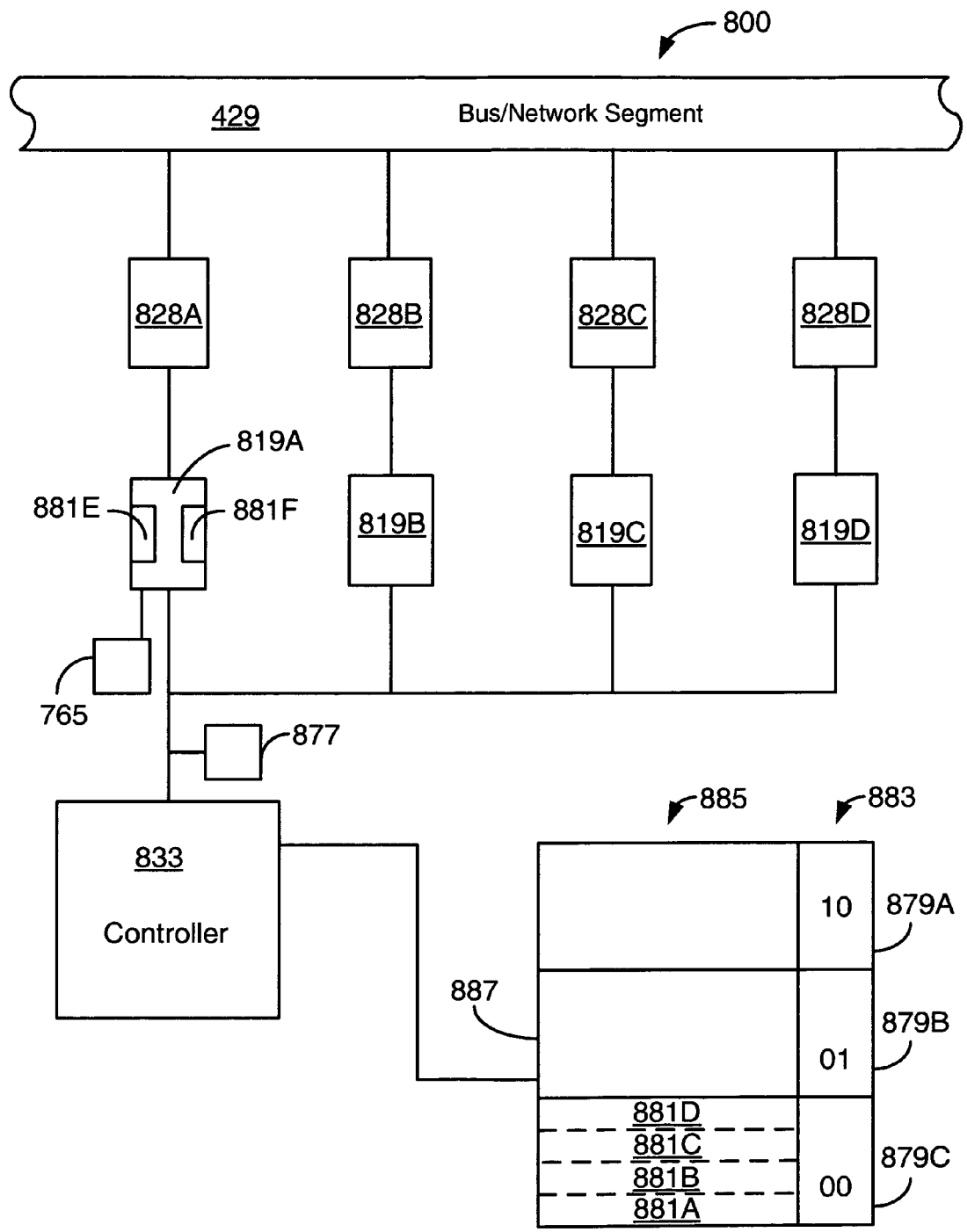
FIG. 8 is a simplified block diagram of a portion of a PLD according to an embodiment of the present invention, showing a plurality of interface blocks to interface a bus, configuration memory associated with the interface blocks, a source of access patterns to be used by the interface blocks and a transfer control unit to assist transfer of select access patterns from the source.

Referencing FIG. 8, in a further embodiment, a controller 833 may be coupled to control a plurality of memories (such as BRAMs) 819A, 819B, 819C, 819D, which may function as configuration memory to corresponding bus masters 828A, 828B, 828C, 828D, respectively. These memories for the bus masters may be driven by controller 833 to sequentially present different bits of the access patterns contained therein for sequential examination and conditional control of their associated bus master. For example, each of the bus masters may be selectively enabled for write/injection access to a TDMA bus/network 429 dependent on the state of the sequential bits being examined therefor during cycling of the access patterns.

Further referencing FIG. 8, a given BRAM 819A may be previously configured/programmed to store a plurality of different access patterns (e.g., 881E, 881F). Controller 833 may select which of the plurality to cycle and present as the access pattern for controlling the associated bus master. For example, controller 833 may set/toggle a flip-flop register 765 to select between one of the predetermined access patterns 881E and 881F. In an alternative embodiment, the given BRAM 819A may comprise more than two access patterns and the controller 833 may drive multiple flip-flops by which to designate one of the plurality of access patterns to present to the bus master. Further, a counter may be operable to repeatedly iterate through the sequence of elements (e.g., bits) of a selected access pattern (e.g. 881E or 881F), similarly as described relative to FIG. 7.

To load the predetermined access patterns into the configuration memories 819A, 819B, 819C, 819D, pattern source such as another memory (e.g., BRAM) 885 may source data to the configuration memories via transfer controller or configurator 833. For example, BRAM 885 may comprise various sets 879A, 879B, and 879C of bit patterns 881A, 881B, 881C, 881D that may be available for transfer to the respective configuration memories for configuring/updating/allocating bandwidths for associated bus masters. In a particular data transfer architecture solution, lower bits 887 of the sets 879A, 879B, and 879C may define the access patterns 881A-D, while upper bits 883 (e.g., "10", "01", and "00") may designate the particular set to which the access patterns belong.

Figure 9:
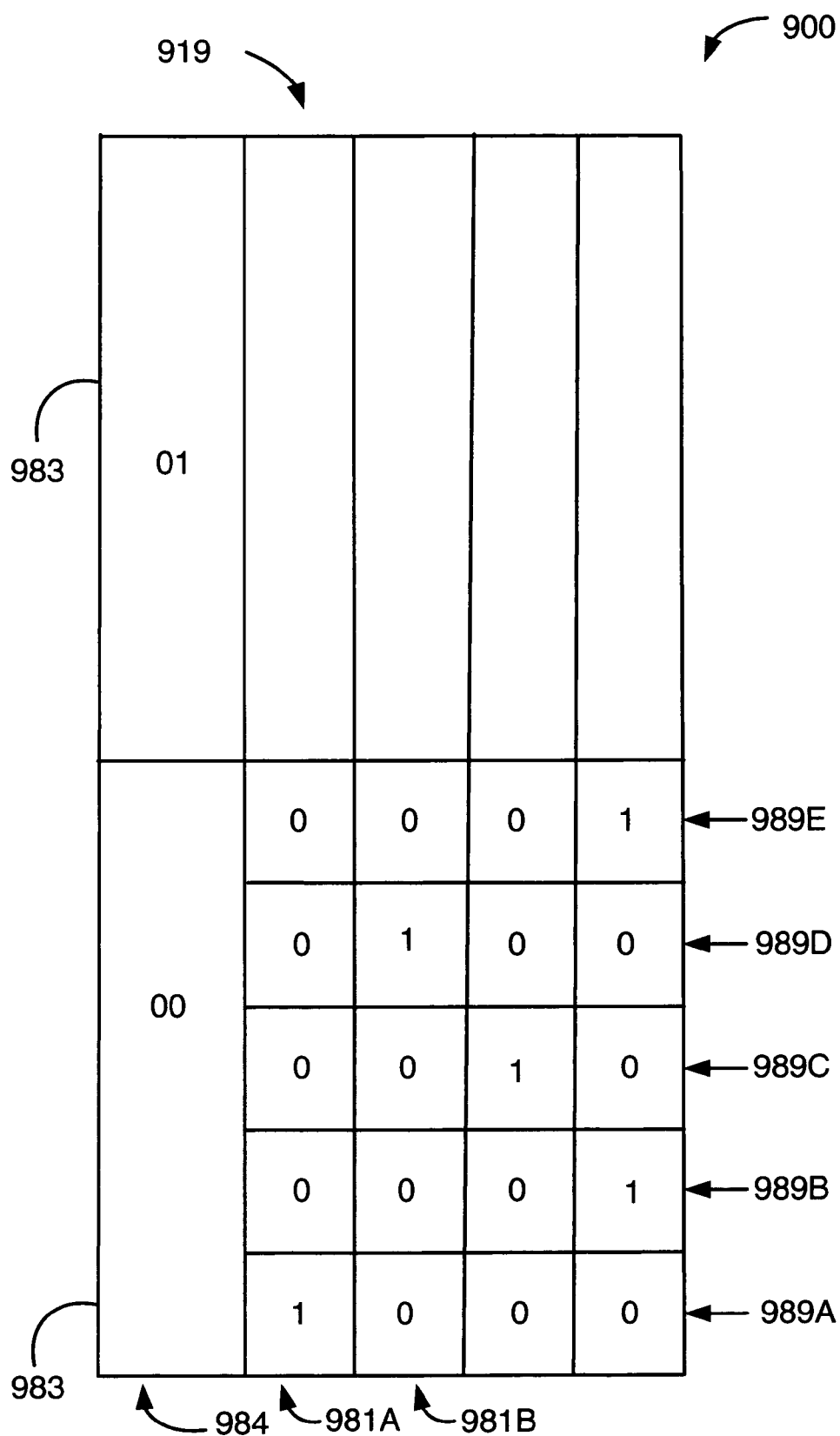
FIG. 9 is a simplified conceptual block diagram of a portion of a PLD according to an embodiment of the present invention, showing storage of a plurality of access bit patterns in a BRAM that may be selected to assist control of bus masters.

Referencing FIG. 9, block RAM 919 may be organized and programmable to contain a plurality of sets 983 of different access patterns 981, 989. The different sets may be selected by high-order address bits 984 (e.g., "00", "01") of the memory's address space.

In a particular embodiment, the bits of a given column, e.g. 981A, may correspond to sequential bits of an access pattern associated with a particular bus master. The bits of another column, e.g. 981B may be associated with another bus master. One row (e.g., 989A) may be addressed during a particular bus cycle to output a bit from each of the access patterns associated with controlling the different masters during a time slot associated with the bit being examined.

In a further possible embodiment, the bus masters may each comprise masks that may mask all but one bit of the row that is mapped thereto. For example, a bus master associated with the bit pattern of column 981A upon receiving the bits of row 989A may mask all but the leftmost bit of row 989A. In another example, the bus master associated with column 981B upon receiving the bits of row 989A may mask all but the second bit of the row. In other words, in each access pattern cycle a bus master may receive, as part of the row, a single bit of its respective access bit pattern. The bus master may then send/inject/write data onto a bus dependent upon the value of the particular bit of the column presented thereto. To sequence through the bits of the different access patterns, one row at a time of the memory may be addressed. Further, the different rows may be presented to the masters for examination in synchronous relationship to an advancement clock that may be related to a clock recovered from the bus. In some embodiments, the different bits may be advanced sequentially in direct frequency relationship to that of the clock recovered from the bus, or in a sub-harmonic relationship thereto.

Depending on the polarity for realization, a bit with a value of "1", e.g., may be effective for enabling the bus master associated with the access pattern to inject data onto the bus. Conversely, a bit with a value of "0" may be operable to disable the bus master from injecting data onto a bus. In a further embodiment, each row 989A, 989B, 989C, 989D, 989E may contain only a single bit with a value of 1, thus enabling only one bus master with the ability to inject data onto the bus in a given advancement cycle and avoiding contention. Stated otherwise, the bits of the respective bit patterns may be generated or defined in a complementary or orthogonal inter-relationship so as to be effective for enabling only one bus master to inject data onto the bus at a time.

Further referencing FIG. 9, the sequential bits of the bit patterns of the different columns 981A, 981B may be described as corresponding to different time slots in a given duration of TDMA bus control. In the schematic illustration of FIG. 9, columns 981A, 981B, within a given set 00 may comprise 5 sequential bits corresponding to 5 possible time slots. Although described with 5 bits in this simplistic example, it may be understood that other bit lengths could be used, and that the number of time slots for access control may depend on the number of bus masters of a given peer network to be associated with a particular bus, the desired order or frequency of use applicable to the respective bus masters or upon other factors.

Relative to another simplified example, a given system may have nine bus masters. A priority or bandwidth allocation request for the system may seek to assign one of the bus masters the ability to inject data onto the bus during 50 percent of the time, and to apportion the remaining time slots equally among the remaining 8 bus masters. The above priority levels may, depending on the particular design, require access patterns of sufficient length to control access to 16 time slots (e.g., 16 bits) instead of the five bit length as illustrated by set 00 in FIG. 9. Half of the 16 bits may be set for one of the access patterns while each of the other access patterns may have only one of the 16 bits set.

It may be understood, therefore, that the memory could be defined by any number of time slots (e.g., 48, 95, 256, etc.) by which to control or distribute bandwidths amongst the masters for access to a TDMA bus.

Figure 10:
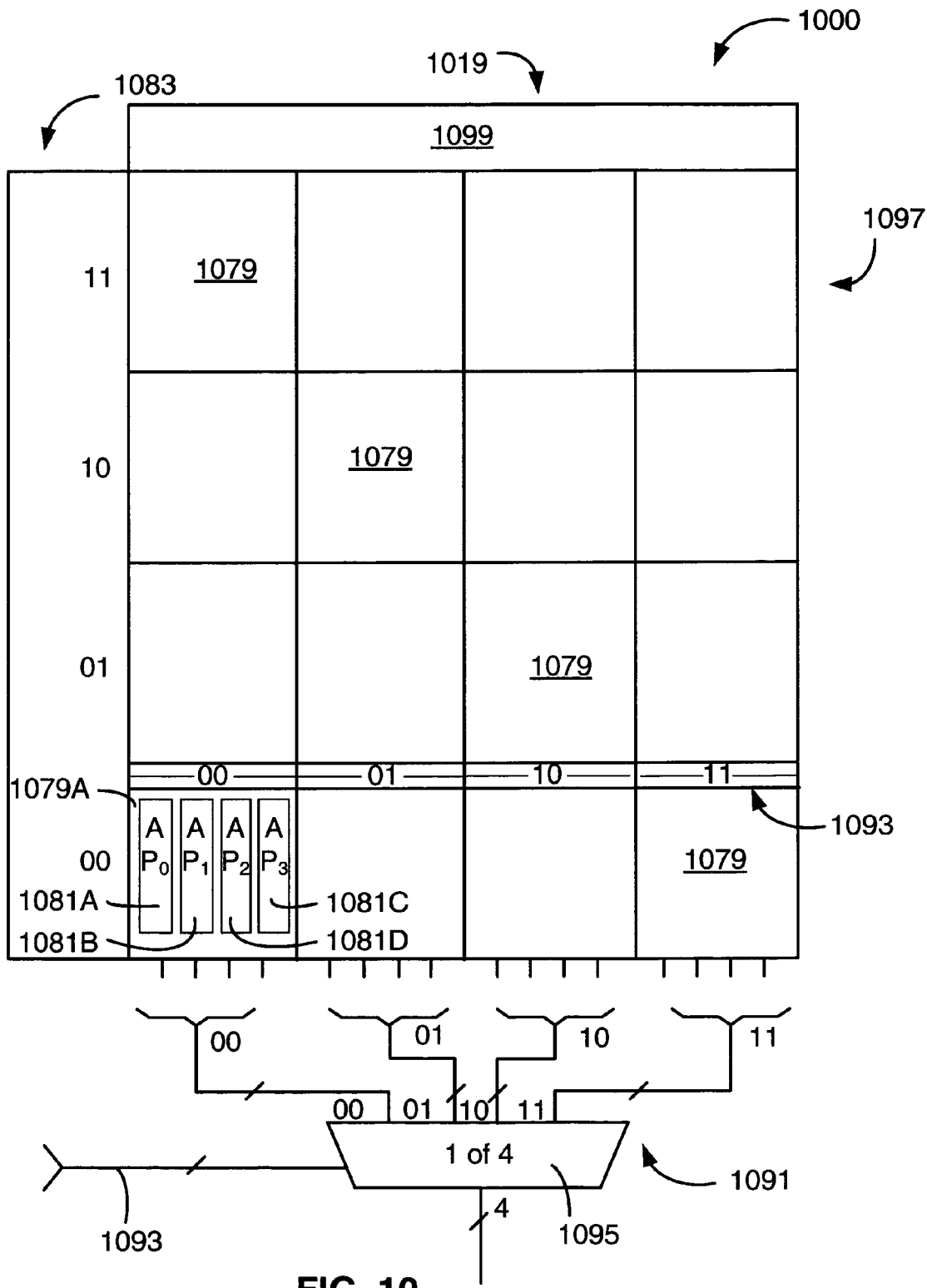
FIG. 10 is a simplified block diagram of a PLD according to an embodiment of the present invention, showing sets of pre-determined access bit patterns stored in a BRAM and an architecture therefor to associate them with different bus masters.

Referencing FIG. 10, a PLD 1000 may comprise a block random access memory 1019 configured as an array of columns 1099 and rows 1097 and with a data architecture to store various sets 1079 of bus access patterns 1081. In a particular embodiment, a particular set 1079A of access patterns may be selected via high-order bits 1083 of the row addressing and high-order bits 1093 of the column addressing. For example, particular access pattern set 1079A may comprise four access patterns 1081A, 1081B, 1081C, and 1081D to be paired with four bus masters. The different access patterns may be aligned sequentially within respective columns 1099.

In a particular embodiment, logic 1091 for selecting an access pattern set may comprise a 1-of-4 multiplexer 1095 operable based on a 2-bit control line. The multiplexer selection bits may be driven by column addressing to select the group of columns of the array from which to source the access patterns. Thus, the combination of the row high-order address bits and the column address bits may be operable to select a particular set of access patterns, e.g., 1079A.

In the illustrated example, row access bits "00" and column address bits "00" may be operable to select access pattern set 1079A. The logic may then be operable to sequence the rows of the row address space 00, and the multiplexer to couple the columns of column set 00 so as to select the bits from the access patterns 1081A-1081D for output to associated bus masters.

Figure 11:
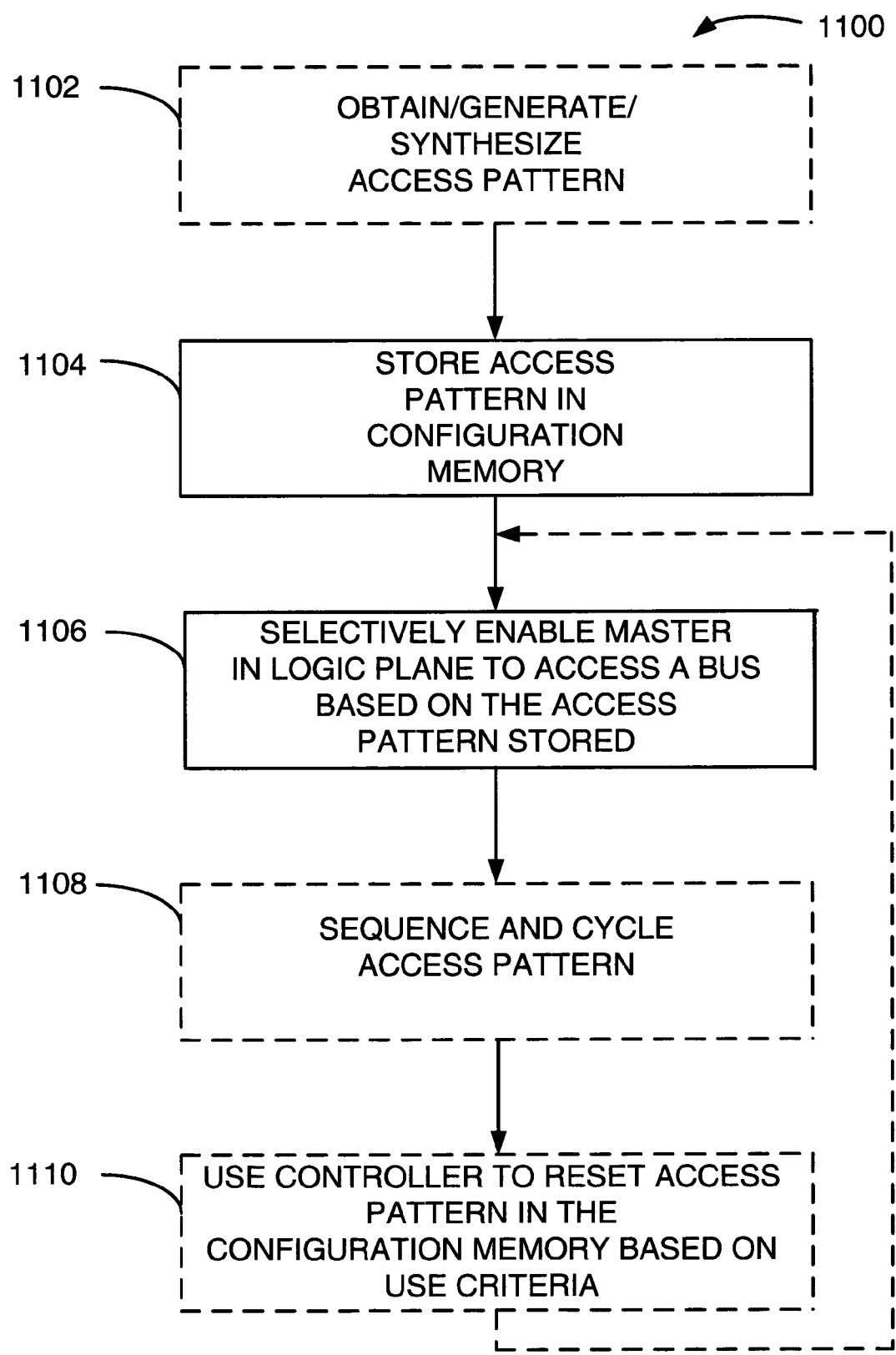
FIG. 11 is a simplified process flow diagram illustrating a method of providing injection rate control to a bus of a PLD, consistent with certain embodiments of the present invention.

Referencing FIG. 11, a method of providing injection rate control for buses/networks with TDMA capability, optionally, may comprise calculating bus access patterns (process block 1102). The access pattern, in a particular embodiment, may be calculated so as to provide access control to a sufficient number of time slots within a given cumulative sequential duration as may be determined appropriate to accommodate control of a given number of bus masters to a peer network on a TDMA bus. The number of time slots to be generated depends on a desired granularity by which the priority or bus access bandwidth is to be allocated to the respective bus masters.

In a further particular embodiment, the total number of time slots may be increased dynamically as the number of bus master peers associated with a TDMA bus increase. Similarly, as discussed with reference to FIG. 9, in a particular embodiment, the number of desired time slots may be increased to accommodate enhanced complexity or granularity demands of the desired access control structure.

In a particular embodiment, the elements of an access control pattern (e.g., the bits of a bit pattern) may correspond to particular time slots of a finite sequential duration, wherein the individual elements of the sequence are to be repeatably cycled. Collectively, the group of access patterns of a given set to be associated with the masters may represent a predetermined schedule for bus access by the respective bus masters of a peer group.

In generating the access patterns, the patterns may be synthesized for complementary or orthogonal inter-relationship, whereby only a selected one of the bus masters of a given peer group may be enabled to inject data onto the bus during a particular time slot.

In a particular embodiment, the access pattern may be generated by a hash function or synthesized using a variety of algorithms. In an alternative embodiment, the access patterns may be obtained from a preprogrammed source either internal or external to the PLD. For example, an initial set of access patterns may be obtained during system start-up from an internal read-only memory. In another example, the initial access patterns may be obtained from logic external to the PLD during a boot-up sequence of the PLD.

In another embodiment associated with assisting configuration of the internal read-only memory with different groups of access patterns, the synthesis of the data for the bit patterns may include a bundling of group designation bits. For example, the synthesis may bundle the data for the access patterns with header information (e.g., within high-order bits) that may be used to designate an association of the given bit patterns to particular groupings or sets. Accordingly, the bit patterns that have been synthesized may be delivered in separate packets during configuration, but retrieved and stored together within appropriate groupings in and during configuration of the PLD. Such packet structures may be understood to lend configuration flexibility and provision or uses as previously discussed with reference to FIGS. 7-10.

Further referencing FIG. 11, an access pattern obtained may then be stored in configuration memory of the configuration memory plane of a PLD (process block 1104). Alternatively, it may be serially loaded into shift registers or otherwise stored on the PLD.

Relative to the method flow chart of FIG. 11, for example, as described earlier with reference to FIG. 6, the access pattern may be stored in shift registers 651 associated with a particular bus master 623. Such shift register may be defined by a single shift register 651 or a plurality of shift registers intercoupled as a single shift register, and may be operable as injection control logic as previously described with reference to FIG. 6.

Again, if an access bit pattern is of a length requiring a chain of shift registers, the access pattern may be distributed among the shift registers of the chain. Further, there may be a plurality of bus masters and each may comprise injection rate control logic 655, and an access pattern may then be stored in each of the respective shift registers (or chain of shift registers). The access patterns for the different masters may be orthogonally inter-related such that only one of the respective bus masters of the plurality is enabled to write to the bus master at a time.

Referencing FIGS. 7 and 11, in another particular embodiment, access patterns may be stored in a block RAM 719, the block RAM operable to sequentially output the access pattern to a paired bus master. In a further embodiment, a plurality of access patterns may be stored in different regions of block RAM 719. One of the plurality of access patterns may then be selectable for output to the paired bus master. For example, the different regions could be selectable based on high-order address bits 771A associated with accessing the memory. Such configuration may be operable as previously described with reference to FIG. 7.

Referencing FIGS. 8 and 11, in another alternative embodiment, a plurality of access patterns may be stored in a block RAM 819A paired to a single bus master 828A. Stored access patterns 881E and 881F of block RAM 819A may be selectable for output of bus master 828A, dependent on a value stored in a flip-flop 877. The storing of the access patterns 881E and 881F into block RAM 819A may be performed using, e.g., programmable controller 833 which may obtain the predetermined access patterns from a block RAM 885 associated with the controller.

Referencing FIGS. 8 and 11, in a particular embodiment, the controller 833 may select another access pattern for output by block RAM 819A. The controller 833 may access an associated block RAM 885 storing potential replacement access patterns 881A-D. Alternatively, the controller 833 may change the value stored in flip-flop 877 to cause a configuration memory 819 to de-select an access pattern (e.g., 811E) and select another access pattern (e.g., 811F). The controller might also be operable to generate the access patterns through the use of a hash function or other algorithm. The newly obtained/generated/synthesized access pattern may then be stored in block RAM 819A and used to selectively enable bus master 828A to access the bus based on the stored access pattern (process block 1106).

For example, further referencing FIGS. 8 and 11, access to the TDMA bus during given time slots may be based on the bits of the access patterns stored and as cycled and presented during examination. As described before relative to FIG. 8, header information 883 may designate one of a plurality of sets 879A, 879B, 879C of different access patterns 881 that may be used to control the access to the bus. The controller 833 may, e.g., search for an access pattern set associated with high-order bits storing "00" may then store the access patterns 881A, 881B, 881C, 881D into configuration memories 819A, 819B, 819C, 819D, respectively. For example, access patterns 881A from source 885 may be stored as access pattern 881E in configuration memory 819A.

Further, the controller may also store a second set of access patterns in the configuration memories, as may be designated by high-order address bits "01" for pattern set 879B. The access patterns of the set 879B may then be stored by the controller 833 as the respective alternative or second available access pattern in configuration memories 819A, 819B, 819C, 819D. For example, in a particular embodiment, one of the access patterns 881 of access pattern set 879B may be stored as access pattern 881F in configuration memory 819A.

During operation, controller 833 may then select one of access patterns 881E, 881F by toggling the value stored in flip-flop 887. In a particular embodiment, a "0" stored in flip-flop 877 may select pattern "0" (e.g., access pattern 881E). A "1" stored in flip-flop 877 may select a pattern "1" (e.g., access pattern 881F). Further, it may be understood that the flip-flop may be representative of, or implemented alternatively by, high-order addressing that may select from one of the plurality of different pre-configured groupings of access patterns.

Further, a counter 765 (e.g., as described before with relation to FIG. 7) of the controller may be operable to iterate through the sequential elements (e.g., bits) of access pattern 881F and serially output for examination the sequential elements of the access pattern 881F to the bus master 828A (block 1108 of FIG. 11). Bus master 828A may then be selectively enabled to write/inject/send data onto the TDMA bus/network 429 dependent upon the element of access pattern 881F being examined over a given interval of time. In a particular embodiment, when the counter causes the configuration memory 819A to read and output the last element of bit pattern 881F, the counter 765 may reset to again repeat the output of the elements of pattern 881F and, thus, repeatedly cycle and output the elements of access pattern 881F.

In another particular embodiment, depending upon usage criteria and dynamically determined desired priority of the bus masters 828A, 828B, 828C, 828D, the controller may respond to a given reallocation request and transition to outputting, for example, access pattern 881F instead of 881E (block 1110 of FIG. 11). In another particular embodiment, the transition may be accomplished by initially causing the configuration memory 819A (per the embodiment described relative to FIG. 8) to select a null-pattern that may temporarily force the bus master 828A to back away and be disabled from injecting data onto the bus 429. The remaining configuration memories 819B, 819C, 819D associated with other masters of the peer group may also sequentially or in parallel be driven by the controller 833 to also transition to and output a null-pattern, and all bus masters 828A, 828B, 828C, 828D may back away from the bus during their reconfiguration or transition of bandwidth allocation, similarly as described previously relative to FIG. 8.

Referencing FIGS. 9 and 11, a plurality of access patterns may be stored (block 1104 of FIG. 11) in rows 989 and columns 981 of a Block RAM 919. The access patterns may be stored within the columns 981 and the individual elements of the respective access patterns associated with a particular time slot may be accessible along a given addressable row 989. In a further embodiment, a plurality of access patterns may be represented by different, e.g., two sets 983 of access patterns. The two sets may be selectable for sequential output and examination (blocks 1108 and 1106 of FIG. 11) dependent on high-order address bits 984 (e.g., "00" or "01") associated with the sets, and different sets may be selected (block 1110 of FIG. 11) by changing the high-order address bits, as previously described with reference to FIG. 9.

Referencing FIGS. 10 and 11, the storage and the selection of different sets 1079 of access patterns 1081 may be further selectable through a combination of high-order bits 1083 associated with row addressing and high-order bits 1093 associated with column addressing. The access patterns 1081 may be aligned sequentially in cells of given columns, and selectable for sequential output and examination (blocks 1106, 1108, 1110 of FIG. 11) as previously described with reference to FIG. 10.

Further referencing FIG. 11, the access patterns stored (block 1104 of FIG. 11) via a configuration plane of the PLD may then be used in the logic plane of a programmable logic array to selectively enable the associated bus master's ability to access a bus (process block 1106).

Further referencing FIG. 11, dependent on use criteria, a controller of the logic plane may optionally be responsive to such usage or reallocation criteria to access the configuration memories of the memory plane and reset or modify the access pattern in the configuration memory (process block 1110). Methods for programming or resetting the access patterns may include those as previously described with reference to FIGS. 6-10.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated memories, ports, controllers or datapaths; adding structures to the PLD, altering the topology, and/or using different types of memory buffers and registers. Such modifications and changes do not depart from the true spirit and scope of the present invention as set forth in the following claims.

What is claimed is:

1. A programmable logic device comprising:
    a bus;
    a plurality of programmable bus masters configurable to interface the bus;
    memory comprising a first portion to source configuration data operable to configure the bus masters of the plurality, and a second portion to source access patterns associated with controlling respective bus masters of the plurality;
    wherein each access pattern comprises a sequence of bits corresponding to time slots of the bus;
    a plurality of injection rate controllers to selectively enable respective ones of the bus masters of the plurality to send data to the bus based on the associated access patterns; and
    wherein the plurality of injection rate controllers implements distributed arbitration for access to the bus by the bus masters, with each injection rate controller being programmed with a respective access pattern and selectively enabling the respective bus master responsive to the programmed, respective access pattern.

2. The device of claim 1, further comprising a programmable controller operable to access and write the access patterns to the second portion of the memory.

3. The device of claim 1, wherein each of the bus masters of the plurality comprises a register to receive the access pattern for controlling access to the bus for that bus master; and
    the register is accessible as a portion of the memory.

4. The device of claim 3, wherein the register comprises at least one of a shift register having its output provided as feedback to drive its input, a function look-up table, and a block of random access memory.

5. The device of claim 4, further comprising a counter operable to repeatedly cycle an address space of the register.

6. A bus interface block providing distributed arbitration for access by a plurality of bus masters to a bus on a programmable logic device (PLD), the bus interface block comprising:
    a send buffer configured to buffer data to be sent on a bus of the PLD from a single bus master;
    wherein the single bus master is one of the plurality of bus masters;
    a transmission engine configured to inject data from the send buffer onto the bus, the transmission engine having an enable line;
    an injection rate controller coupled to the enable line to cycle through an access pattern associated with the bus interface block and selectively enable the transmission engine based on the access pattern;
    wherein the injection rate controller is dedicated to the single bus master and the access pattern defines for only the single bus master each timeslot during which the single bus master is enabled to inject data onto the bus;
    wherein the injection rate controller is programmed with the access pattern;
    the access pattern having a sequence of bits corresponding to time slots of the bus; and wherein the access pattern is dedicated to the single bus master.

7. The bus interface block of claim 6, wherein the injection rate controller comprises at least one register to store the access pattern, the at least one register operable to repeatedly sequence through data stored therein.

8. The bus interface block of claim 7, wherein the at least one register comprises a shift register having an output and an input, the output of the shift register coupled to drive the input of the shift register, the shift register clocked by an advancement clock having a frequency of sub-harmonic relationship to frequency of the bus.

9. The bus interface block of claim 8, further comprising:
an allocator to generate the access pattern associated with the bus interface block; and
a configurator to configure the injection rate controller with the generated access pattern.

10. The bus interface block of claim 9, wherein the allocator is operable to generate the access pattern based on at least one of a bandwidth allocation and a priority for the bus interface block; and
wherein the allocator and the configurator are further operable to update the access pattern responsive to receipt of at least one of a bandwidth reallocation request and a desired priority.

11. The bus interface block of claim 10, wherein the at least one of the bandwidth reallocation request and the desired priority is dynamically determined.

12. The bus interface block of claim 6, wherein the injection rate controller comprises a memory to store the access pattern; and
a counter configured to sequence a given addressable range of the memory and cycle through the bits of the access pattern.

13. The bus interface block of claim 12, wherein the memory stores a plurality of access patterns; and
wherein the injection rate controller is configured to select one of the plurality of access patterns as the access pattern.

14. The bus interface block of claim 13, wherein the injection rate controller further comprises:
a pattern selector configured to select the one of the plurality of access patterns by selecting a given region of a plurality of regions of the memory for the counter to sequence.

15. The bus interface block of claim 14, wherein
the counter is configured to drive lower significant bits of addressing of the memory; and
the pattern selector is configured to drive upper significant bits of the addressing of the memory.

16. The bus interface block of claim 12, wherein the memory to store the access pattern is shared with at least one other bus interface block of the PLD.

17. A method of operating a programmable logic device (PLD) comprising:
configuring the PLD to implement a plurality of bus masters that are coupled to a bus;
storing a plurality of access bit patterns in a first portion of configuration memory of the programmable logic device;
wherein each bit pattern is associated with a respective one of the bus masters and each bus master is responsive to the associated bit pattern;
cycling through and examining each bit of a sequence of bits of the associated access bit pattern by each bus master;
selectively enabling a master of the programmable logic device to send data to the bus, the selectively enabling based on the state of each cycled and examined bit; and
wherein the selectively enabling includes each bus master selectively enabling itself to send data to the bus;
wherein distributed arbitration for access to the bus by the plurality of bus masters is implemented with each bus master selectively enabling itself in response to the stored, associated access bit pattern and the state of each cycled and examined bit in the associated access bit pattern.

18. The method of claim 17, further comprising:
receiving a bandwidth request; and
generating the access pattern depending on the bandwidth request, wherein a ratio of one to zero bits within the access pattern is related to the bandwidth request.

19. The method of claim 17, wherein:
the access pattern is stored in a given address space of the configuration memory; and
the cycling through and examining each bit of a sequence of bits of the access bit pattern comprises sequentially addressing the addresses of the given address space and sourcing bits by which to control the selectively enabling of the master from a data output of the memory associated with the master.

20. The method of claim 19, further comprising:
storing different access patterns in different addressable spaces of the configuration memory; and
selecting one of the different address spaces to sequentially address based on a given bandwidth allocation for the master.

* * * * *